(12) United States Patent
Vaisband et al.

(10) Patent No.: US 11,257,746 B2
(45) Date of Patent: Feb. 22, 2022

(54) POWER DISTRIBUTION WITHIN SILICON INTERCONNECT FABRIC

(71) Applicant: THE REGENTS OF THE UNIVERSITY OF CALIFORNIA, Oakland, CA (US)

(72) Inventors: Boris Vaisband, Los Angeles, CA (US); Subramanian S. Iyer, Los Angeles, CA (US); Adeel A. Bajwa, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/760,845

(22) PCT Filed: Nov. 1, 2018

(86) PCT No.: PCT/US2018/058722
§ 371 (c)(1),
(2) Date: Apr. 30, 2020

(87) PCT Pub. No.: WO2019/089935
PCT Pub. Date: May 9, 2019

(65) Prior Publication Data
US 2021/0225749 A1    Jul. 22, 2021

Related U.S. Application Data

(60) Provisional application No. 62/580,944, filed on Nov. 2, 2017.

(51) Int. Cl.
*H05K 1/00* (2006.01)
*H01L 23/498* (2006.01)
(Continued)

(52) U.S. Cl.
CPC ...... *H01L 23/49827* (2013.01); *H01L 23/147* (2013.01); *H01L 23/473* (2013.01); *H01L 23/49811* (2013.01); *H01L 23/49866* (2013.01)

(58) Field of Classification Search
CPC ............ H01L 23/49827; H01L 23/147; H01L 23/49866; H01L 23/473; H01L 23/49811
See application file for complete search history.

(56) References Cited

U.S. PATENT DOCUMENTS 6,052,287 A * 4/2000 Palmer .............. H01L 23/49827
                                                     174/255
7,733,661 B2 * 6/2010 Kossives ................. H05K 1/16
                                                       361/760
(Continued)

OTHER PUBLICATIONS

International Search Report and Written Opinion, issued in Int'l. Appln. No. PCT/US2018/058722, 9 pages (dated Jan. 10, 2019).
(Continued)

*Primary Examiner* — Yuriy Semenenko
(74) *Attorney, Agent, or Firm* — Foley & Lardner LLP

(57) ABSTRACT

A silicon interconnect fabric includes: (1) a substrate having a front side and a back side; (2) a front side patterned metal layer on the front side of the substrate; (3) a back side patterned metal layer on the back side of the substrate; (4) multiple conductive vias extending through the substrate and connecting the front side patterned metal layer and the back side patterned metal layer; and (5) multiple conductive posts connected to the back side patterned metal layer.

20 Claims, 7 Drawing Sheets

(51) Int. Cl.
*H01L 23/14* (2006.01)
*H01L 23/473* (2006.01)

(56) References Cited

U.S. PATENT DOCUMENTS

| | | | | |
|---|---|---|---|---|
| 8,283,771 | B2* | 10/2012 | Somasekhar | H01L 25/18 |
| | | | | 257/698 |
| 8,933,345 | B1* | 1/2015 | Rahman | H01L 22/34 |
| | | | | 174/262 |
| 9,026,872 | B2* | 5/2015 | Camarota | G01R 31/28 |
| | | | | 714/725 |
| 9,671,457 | B2* | 6/2017 | Wang | G01R 1/07378 |
| 9,799,571 | B2* | 10/2017 | Gong | H01L 22/34 |
| 10,438,929 | B2* | 10/2019 | Kouchi | G11C 5/00 |
| 2002/0029901 | A1* | 3/2002 | Mays | B23K 35/0222 |
| | | | | 174/260 |
| 2015/0243617 | A1* | 8/2015 | Osenbach | H01L 24/06 |
| | | | | 257/737 |
| 2016/0276237 | A1* | 9/2016 | Lin | H01L 24/11 |

OTHER PUBLICATIONS

Zheng, et al., "Electrical and Fluidic Microbumps and Interconnects for 3D-IC and Silicon Interposer", IEEE Int'l. SOC Conference, pp. 159-164 (2012).

* cited by examiner

POWER DISTRIBUTION WITHIN SILICON INTERCONNECT FABRIC

CROSS-REFERENCE TO RELATED APPLICATIONS

This application is a National Stage Entry of International Application No. PCT/US2018/058722, filed Nov. 1, 2018, which claims the benefit of U.S. Provisional Application No. 62/580,944, filed Nov. 2, 2017, the contents of which are incorporated herein by reference in their entirety.

STATEMENT REGARDING FEDERALLY SPONSORED RESEARCH OR DEVELOPMENT

This invention was made with Government support under FA8650-16-1-7648, awarded by the U.S. Department of Defense, Defense Advanced Research Projects Agency, and N00014-16-1-2639, awarded by the U.S. Navy, Office of Naval Research. The Government has certain rights in the invention.

TECHNICAL FIELD

This disclosure generally relates to a silicon interconnect fabric (Si-IF) and, in particular, power distribution within the Si-IF.

BACKGROUND

Si-IF is a wafer-scale platform for heterogeneous integration. Individual bare (unpackaged) dies are integrated on top of a silicon substrate using thermal compression bonding (TCB) process. Si-IF is developed on a silicon substrate exploiting mature silicon fabrication techniques. Si-IF allows packaging of dies to be omitted, since dimensions (width and pitch) of the interconnect fabric are similar to dimensions of on-chip interconnect. In this technology, unlike within printed circuit boards (PCBs) that the Si-IF platform replaces, dies are placed in high proximity to each other (e.g., about 50 µm to about 100 µm), and fine pitch (e.g., few µm) vertical pillars, which connect the dies to the Si-IF, provide high density of interconnections between dies. Despite these benefits, power distribution is a particular challenge for Si-IF.

It is against this background that a need arose to develop the embodiments described herein.

SUMMARY

In some embodiments, a power distribution methodology is proposed to support power delivery within a Si-IF platform. Si-IF is a wafer-scale integration platform for integration of heterogeneous systems. Bare dies are connected using TCB to a silicon substrate. To accommodate power specifications of a wafer-scale system, it is proposed to deliver power from a back side of the Si-IF using large square-shaped stubs. The power is delivered to a front side of the Si-IF using through wafer vias (TWVs). A power distribution network (PDN) doubles as a heat extraction system, including liquid cooling channels embedded within the stubs. Voltage drop and power dissipation within a PDN have been evaluated. The PDN exhibits a worst case voltage drop of about 298 µV and dissipates about 248 mW, for nominal geometric and electrical parameters (power of about 10 KW and voltage of about 12 V). The PDN also supports multiple voltage domains and allows omission of power distribution at high voltage; therefore, complex power converters may be omitted on the front side of the Si-IF.

In some embodiments according to a first aspect, a Si-IF includes: (1) a substrate having a front side and a back side; (2) a front side patterned metal layer on the front side of the substrate; (3) a back side patterned metal layer on the back side of the substrate; (4) a plurality of conductive vias extending through the substrate and connecting the front side patterned metal layer and the back side patterned metal layer; and (5) a plurality of conductive posts connected to the back side patterned metal layer.

In some embodiments according to the first aspect, the substrate is a silicon substrate.

In some embodiments according to the first aspect, the Si-IF further includes a plurality of dies on the front side patterned metal layer.

In some embodiments according to the first aspect, the conductive vias are TWVs.

In some embodiments according to the first aspect, the conductive vias are formed of, or include, copper or another metal or a metal alloy.

In some embodiments according to the first aspect, the conductive vias have a lateral dimension in a range of about 10 µm to about 500 µm, about 50 µm to about 300 nm, about 50 µm to about 150 µm, or about 100 µm, and a height in a range of about 100 µm to about 1000 µm, about 200 µm to about 800 µm, about 300 µm to about 700 µm, or about 500 µm.

In some embodiments according to the first aspect, a top end of each of the conductive vias is exposed from the substrate at the front side of the substrate. In some embodiments, a bottom end of each of the conductive vias is exposed from the substrate at the back side of the substrate. In some embodiments, each of the conductive vias extends between (e.g., extends fully between) the front side and the back side of the substrate.

In some embodiments according to the first aspect, the conductive posts include power stubs and ground stubs.

In some embodiments according to the first aspect, the conductive posts are formed of, or include, copper or another metal or a metal alloy.

In some embodiments according to the first aspect, the conductive posts have a lateral dimension in a range of about 0.1 mm to about 10 mm, about 0.5 mm to about 5 mm, about 0.5 mm to about 2 mm, or about 1 mm, and a height in a range of about 0.5 mm to about 10 mm, about 0.5 mm to about 5 mm, about 0.5 mm to about 2 mm, or about 1 mm.

In some embodiments according to the first aspect, at least one of the conductive posts defines a liquid cooling channel extending at least partially across a width of the conductive post. In some embodiments, the conductive post includes a heat transfer liquid disposed in the liquid cooling channel.

In some embodiments according to a second aspect, a Si-IF includes: (1) a substrate having a front side and a back side; (2) a metal layer on the front side of the substrate; (3) a conductive pad on the back side of the substrate; (4) a conductive post connected to the conductive pad; and (5) a plurality of conductive vias extending through the substrate and connecting the metal layer and the conductive pad.

In some embodiments according to the second aspect, the substrate is a silicon substrate.

In some embodiments according to the second aspect, the Si-IF further includes a die on the metal layer.

In some embodiments according to the second aspect, the conductive post defines a liquid cooling channel extending at least partially across a width of the conductive post. In some embodiments, the conductive post includes a heat transfer liquid disposed in the liquid cooling channel.

In some embodiments according to the second aspect, the conductive vias are disposed over and within a perimeter of the conductive post, as viewed when the conductive vias are projected onto the conductive post.

In some embodiments according to the second aspect, the conductive vias are TWVs.

In some embodiments according to the second aspect, the conductive vias are formed of, or include, copper or another metal or a metal alloy.

In some embodiments according to the second aspect, the conductive vias have a lateral dimension in a range of about 10 μm to about 500 μm, about 50 μm to about 300 μm, about 50 μm to about 150 μm, or about 100 μm, and a height in a range of about 100 nm to about 1000 μm, about 200 μm to about 800 μm, about 300 μm to about 700 μm, or about 500 μm.

In some embodiments according to the second aspect, a top end of each of the conductive vias is exposed from the substrate at the front side of the substrate. In some embodiments, a bottom end of each of the conductive vias is exposed from the substrate at the back side of the substrate. In some embodiments, each of the conductive vias extends between (e.g., extends fully between) the front side and the back side of the substrate.

In some embodiments according to the second aspect, the conductive post is a power stub or a ground stub.

In some embodiments according to the second aspect, the conductive post is formed of, or include, copper or another metal or a metal alloy.

In some embodiments according to the second aspect, the conductive post has a lateral dimension in a range of about 0.1 mm to about 10 mm, about 0.5 mm to about 5 mm, about 0.5 mm to about 2 mm, or about 1 mm, and a height in a range of about 0.5 mm to about 10 mm, about 0.5 mm to about 5 mm, about 0.5 mm to about 2 mm, or about 1 mm.

In some embodiments according to the second aspect, the conductive pad, the conductive post, and the conductive vias are a first conductive pad, a first conductive post, and first conductive vias, respectively, and the Si-IF further includes a second conductive pad on the back side of the substrate, a second conductive post connected to the second conductive pad, and a plurality of second conductive vias extending through the substrate and connecting the metal layer and the second conductive pad.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DETAILED DESCRIPTION

Figure 1:
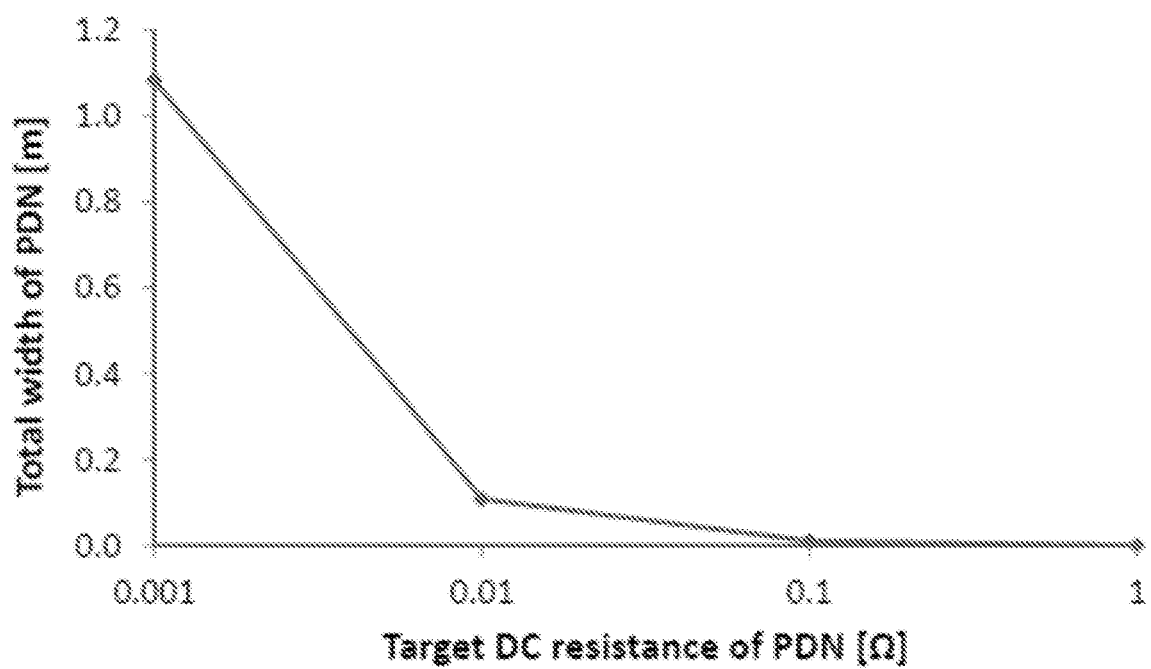
FIG. 1. A tradeoff between width and resistance of a Si-IF PDN. In this evaluation, a power input to a Si-IF is assumed to be from one side of a wafer, similar to PCBs.
Figure 2:
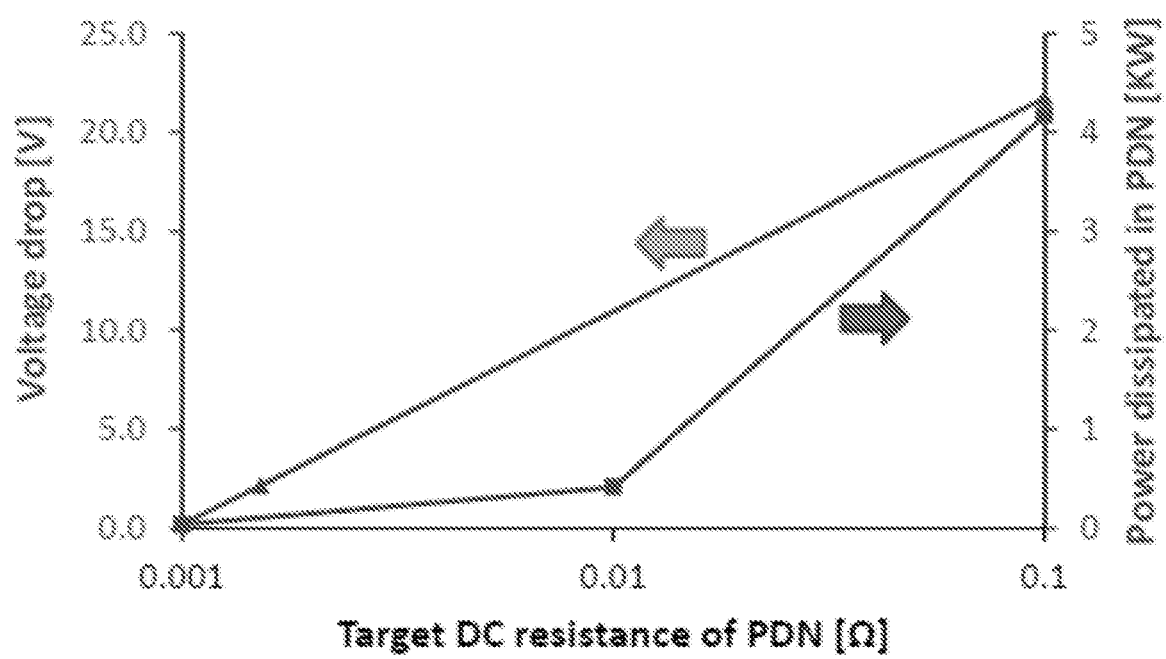
FIG. 2. A tradeoff between voltage drop and power dissipated within a PDN, and resistance of the PDN. In this evaluation, a power input to a Si-IF is assumed to be from one side of a wafer, similar to PCBs.

Power distribution is a particular challenge in large integrated systems. This issue is significantly exacerbated in wafer-scale integration due to the large wafer area (typically up to about 300 mm in diameter or more). The main challenges are to reduce the voltage drop (IR) and the power ($I^2R$) dissipated within a PDN. Distribution of power at high voltage (typically about 48 V) and low DC resistance (several mΩ) in a PDN design allows effective power distribution to be achieved within typical PCBs. Applying the same approach in a Si-IF, however, introduces additional challenges. Since the Si-IF employs silicon processing techniques, a metal thickness within the interconnect fabric is constrained to about 4 μm, as compared to a thickness of about 25 μm in PCB traces. If a power input to the Si-IF is assumed to be from a single side of a wafer, similar to a typical power input in PCBs, the resistance of a PDN should be very low. For this configuration of input power, unreasonably wide metal planes are included to maintain low DC resistance of a Si-IF PDN, as shown in FIG. 1. Since Si-IF is a platform for ultra-large scale heterogeneous integration, a system within the Si-IF platform is expected to consume significantly higher power (about 10 KW) than typical PCBs. For an expected power of about 10 KW and a high power distribution voltage of about 48 V, the worst case voltage drop and maximum power dissipation within the PDN are shown in FIG. 2 for different PDN target resistances. The stringent criterion on the resistance is further confirmed by the data in FIG. 2. Effectively, a PCB-like PDN is not feasible within the Si-IF platform; for example, about 43 W is dissipated in an about 1 mΩ PDN, which in turn specifies a power plane over about 1 m wide.

An improved power distribution approach, described below, is proposed in some embodiments to overcome the issues associated with distributing power within the Si-IF platform. Evaluation results of the proposed power distribution approach are also provided, followed by some conclusions.

Power Distribution Approach for Si-if

Figure 3:
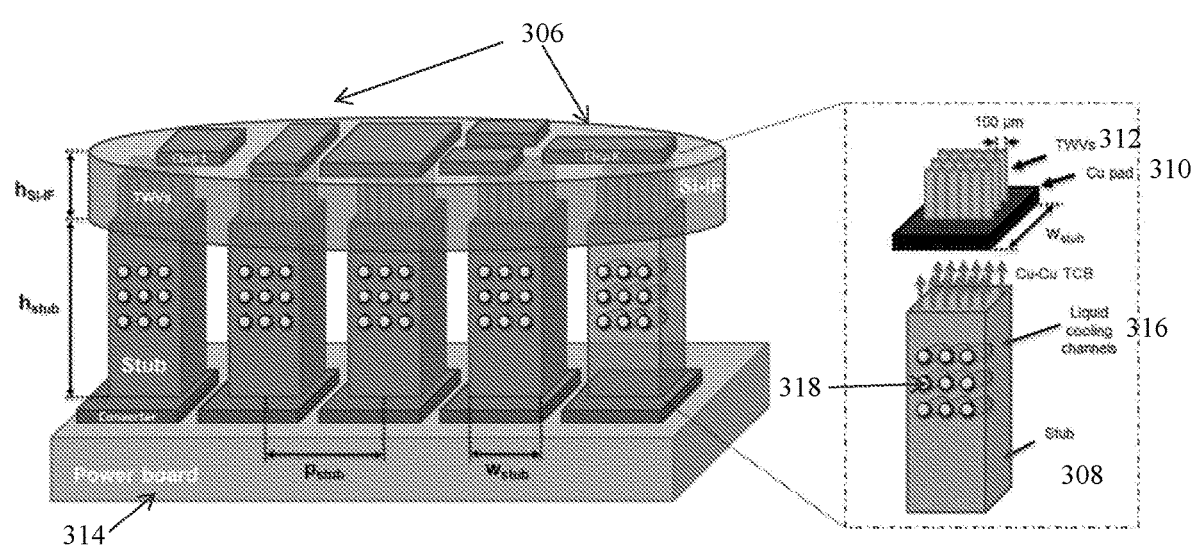
FIG. 3. PDN on a back side of a Si-IF. The PDN includes vertical stubs arranged in a pattern bonded to a patterned metal layer on the back side of the Si-IF using TCB.
Figure 4:
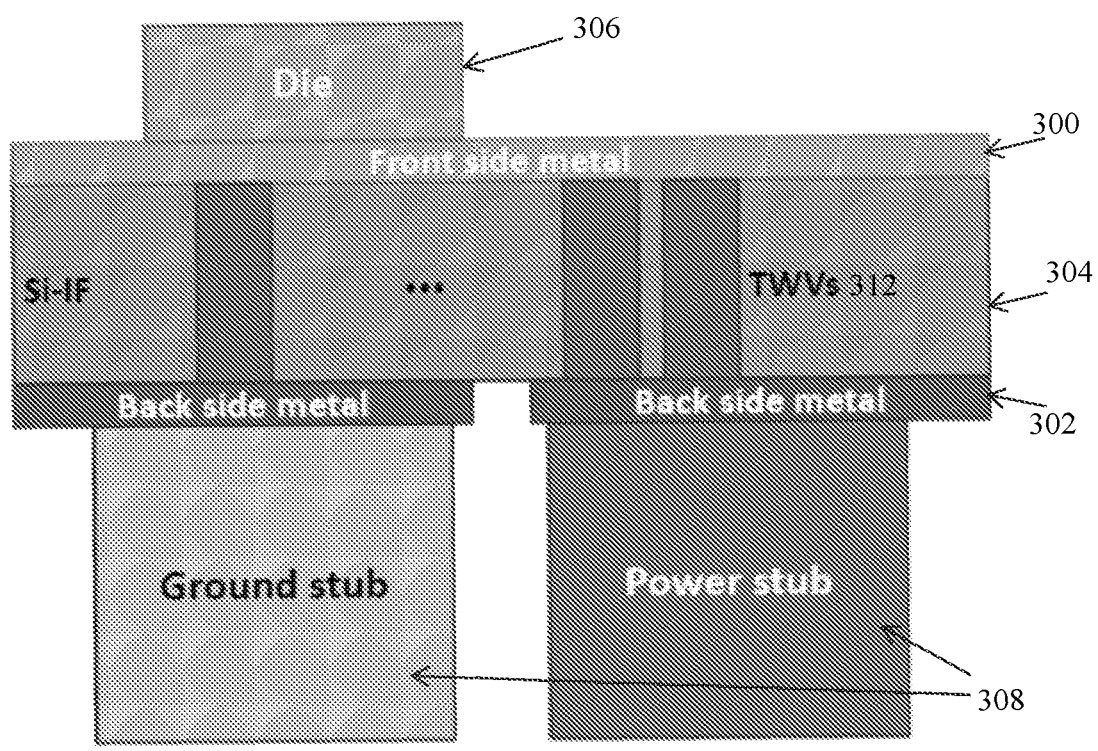
FIG. 4. Illustration of TWVs that penetrate a Si-IF substrate and connect to power/ground stubs on a back side. A back side metal layer is patterned to isolate power stubs from ground stubs.

In some embodiments, and with reference to FIGS. 3 and 4, a Si-IF is a symmetric platform where metal layers 300 and 302 are fabricated on both sides of a substrate 304, such as a silicon substrate. A front side of the Si-IF is the side of bonded dies 306, whereas a back side of the Si-IF is dedicated to power distribution and passive devices (e.g., capacitors and inductors). Unlike PCBs, that are inserted sideways into slots and receive power through connectors fabricated on a same edge of a board, the Si-IF is placed into a round socket, similar to compact discs placed within optical drives. Interdigitated conductive posts in the form of power/ground (P/G) stubs 308, arranged in a pattern (e.g., a hexagonal pattern or another regular or irregular pattern) and formed of, or including, copper (Cu) or another metal or a metal alloy, are connected to similarly arranged conductive pads 310, formed of, or including, Cu or another metal or a metal alloy, on the Si-IF back side using TCB (solder based bonding is also possible). The P/G stubs 308 are used to connect the Si-IF to the socket by either low insertion force connectors or using wires. As shown in FIG. 3, the P/G stubs 308 each has a square cross-sectional shape, although other polygonal or non-polygonal shapes (e.g., circular) are contemplated. A schematic of the power delivery approach is shown in FIG. 3. Cu interconnects within metal planes are patterned to isolate power stubs from ground stubs. The geometric parameters noted in FIG. 3 are summarized in Table I according to some embodiments.

TABLE I

GEOMETRIC PARAMETERS OF THE PDN DESCRIBED IN FIG. 3

| Parameter | Value | Description |
|---|---|---|
| $w_{stub}$ | Fraction of a millimeter to several millimeters | Stub width |
| $p_{stub}$ | Fraction of a millimeter to several millimeters | Pitch between any two stubs |
| $h_{stub}$ | From 500 μm to few millimeters | Stub height |
| $h_{Si-IF}$ | 500 μm | Si-IF substrate height |

The dimensions of the P/G stubs 308 may vary according to the socket configuration, mechanical stress, and thermal characteristics of the system. However, regardless of the socket configuration, and mechanical and thermal characteristics, the P/G stubs 308 typically serve as a first layer of the PDN delivering external power to the back side of the Si-IF. The next layer of the PDN delivers power to the front side of the Si-IF substrate, by utilizing conductive vias in the form of TWVs 312. In some embodiments, the TWVs 312 are about 100 μm in diameter and about 500 μm in height conductive vias, formed of, or including, Cu or another metal or a metal alloy, which penetrate the Si-IF substrate 304 and connect to the metal layers 300 and 302 on the front side and the back side. As shown in FIG. 3, the TWVs 312 are arranged such that multiple ones of the TWVs 312 are assigned to each of the P/G stubs 308, and are disposed over and connected to each of the P/G stubs 308. The PDN including the P/G stubs 308, the TWVs 312, and the front side and back side metal layers 300 and 302, is illustrated in FIG. 4.

The proposed PDN is expected to distribute typical PCB voltages (e.g., about 12 V or smaller); however, other voltages can also be distributed. Conversion from about 48 V to specified voltages is performed on a power board 314, as depicted in FIG. 3. In addition, the configuration of P/G stubs 308 in FIG. 3 allows multiple voltages to be provided to the Si-IF from the socket. Specific P/G stubs 308 (in relevant locations within the Si-IF) can be grouped and assigned specific voltages according to system specifications. After the power is distributed to the front side of the Si-IF, local power conversion to point of load voltages and regulation is available using power conversion and regulation circuits within power converters/regulators. The power converters/regulators are placed within dedicated utility dies, among the dies 306, bonded on the Si-IF (similar to other functional dies). The passive devices (e.g., inductors and capacitors) for local conversion (if specified) are placed either on the back side of the utility dies or on the back side of the Si-IF, accessible using the TWVs 312.

In addition to supplying power to the heterogeneous system, integrated within the Si-IF, the PDN provides a favorable path for heat conduction. The TWVs 312 and P/G stubs 308 are formed of Cu and, therefore, exhibit low thermal resistivity. The Si-IF substrate 304 is a silicon substrate that facilitates heat spreading horizontally across the wafer, and the heat can then propagate through the vertical Cu paths, away from the dies 306 on the front side of the Si-IF. Furthermore, liquid cooling channels 316 embedded within the P/G stubs 308 (as shown in FIG. 3) are used to effectively dissipate the heat to an ambient environment. The channels 316 extend at least partially across widths of the P/G stubs 308, and a heat transfer liquid 318 is disposed in the channels 316.

Evaluation of Power Distribution Approach

A preliminary evaluation of the proposed PDN is provided in this section. The geometric and electrical parameters that were used in the evaluation of the PDN are summarized in Table II.

Figure 5:
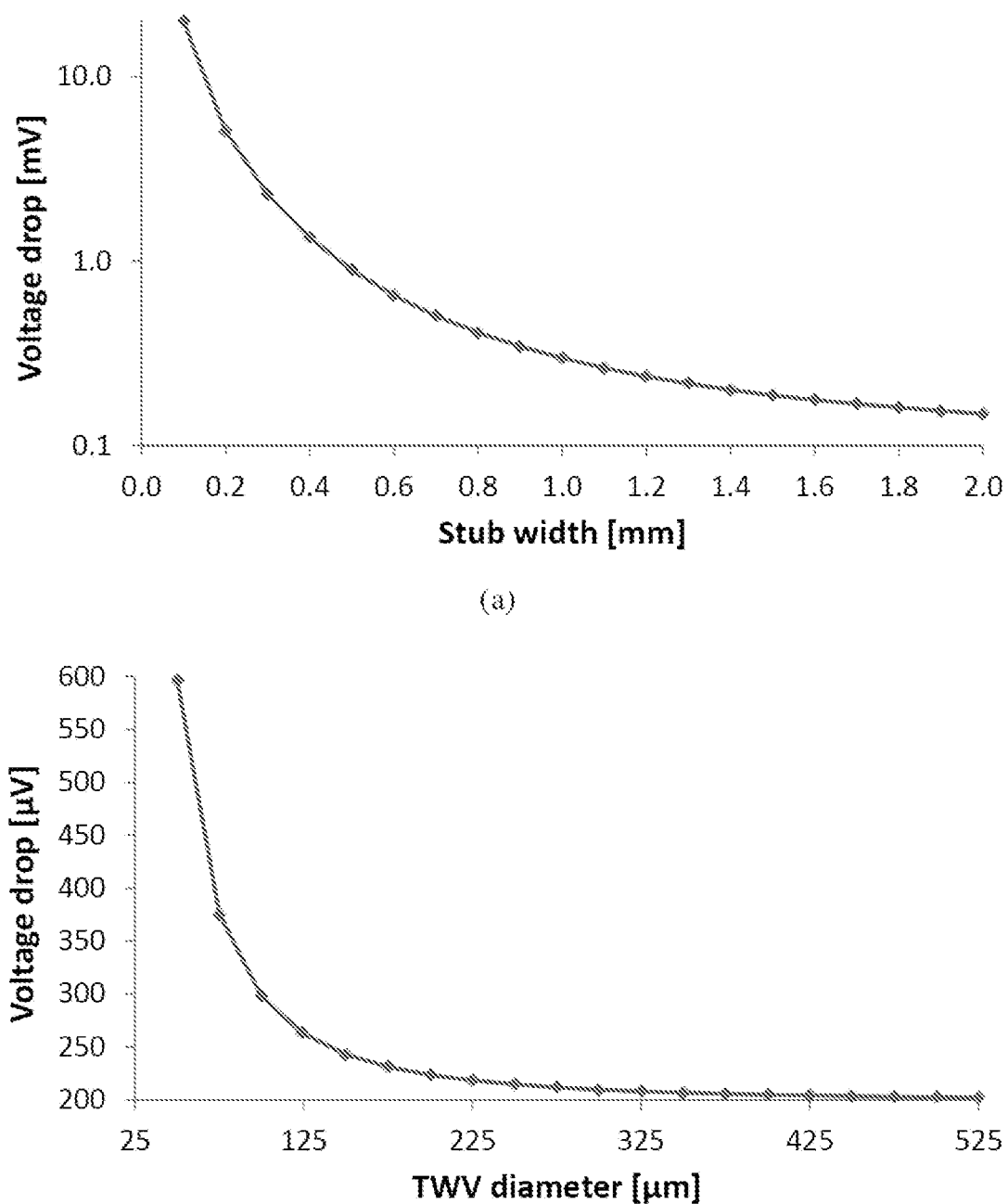
FIG. 5. Voltage drop as function of (a) stub width and (b) TWV diameter.

The PDN was evaluated for voltage drop as function of the dimensions of the P/G interconnects (width of stubs and diameter of TWVs). About 1% of the effective wafer area is assumed to be dedicated to the vertical interconnects, driven by the technological aspects of TWV fabrication. Although a similar percentage is used for the P/G stubs, effectively a larger area can be dedicated since the stubs are not penetrating the wafer. Evaluation of voltage drop versus width of stubs and diameter of TWVs is shown in FIG. 5. For the nominal dimensions of stubs and TWVs (Table II), the voltage drop across the entire PDN is about 298 μV (out of a distributed voltage of about 12 V). In addition to the small voltage drop for the nominal values, it can be concluded from FIG. 5 that the voltage drop saturates for larger dimensions of both the stubs and the TWVs. It is therefore not necessary to increase the dimensions of the vertical interconnects beyond the nominal values for the purpose of reducing voltage drop.

Figure 6:
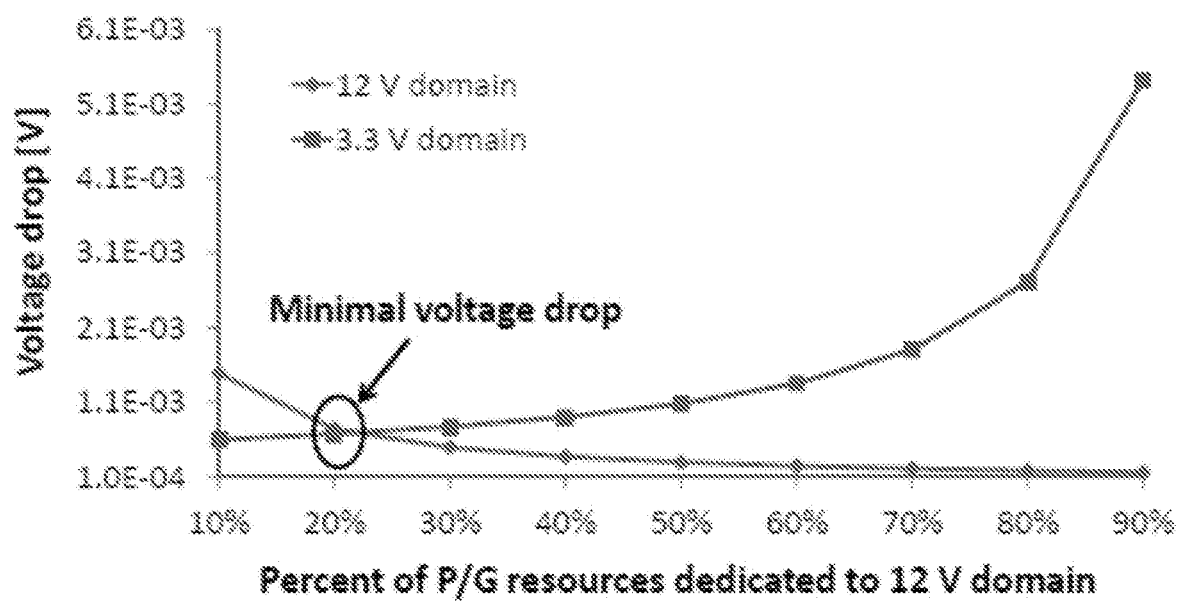
FIG. 6. Evaluation of voltage drop for two voltage domains: about 12 V and about 3.3 V. The horizontal axis is the percent of power/ground interconnect resources that are assigned to the about 12 V domain. The remaining power/ground resources are assigned to the about 3.3 V domain.

As described above, multiple voltages can be distributed within the PDN. An additional design criteria becomes evident when distributing multiple voltages—effective assignment of P/G interconnect resources to the different voltage domains. Evaluation of voltage drop within the PDN for two voltage domains, about 12 V and about 3.3 V, is shown in FIG. 6. The horizontal axis in FIG. 6 corresponds to the percentage of P/G interconnect resources (out of all available resources) that are assigned to the about 12 V domain. Consequently, the remaining P/G interconnect resources are assigned to the about 3.3 V domain. It is also assumed that each voltage domain is distributing half of the total power (about 10 KW). This assumption may not always be applicable, and a per-case evaluation is involved for other power distribution specifications. A minimum voltage drop point is marked in FIG. 6, denoting the ratio of P/G resources that provides the best electrical performance of the PDN, namely lowest voltage drop.

Current density within the TWVs has also been evaluated. Since the cross-sectional area of stubs is significantly larger than that of TWVs, electromigration is not expected within the stubs. However, if solder bonding is used to connect the stubs to the Si-IF, evaluation of the solder joints will be involved. The worst case current density within TWVs (for the nominal values in Table II) is about 0.01 μA/μm2, which is well within typical maximum current density of Cu vias.

TABLE II

GEOMETRIC AND ELECTRICAL PARAMETERS OF THE EVALUATED PDN

| Parameter | Value |
| --- | --- |
| Stub width | 1 mm |
| Stub height | 1 mm |
| Stub pitch | 2 mm |
| TWV diameter | 100 μm |
| TWV height | 500 μm |
| TWV pitch | 200 μm |
| Effective Si-IF area | 63.600 mm$^2$ |
| Percent area dedicated to stubs/TWVs | 1% |
| Distributed power | 10 KW |
| Distributed voltage | 12 V |
| Stub resistance (Cu) | 21.9 μΩ |
| TWV resistance (Cu) | 1.09 mΩ |

Figure 7:
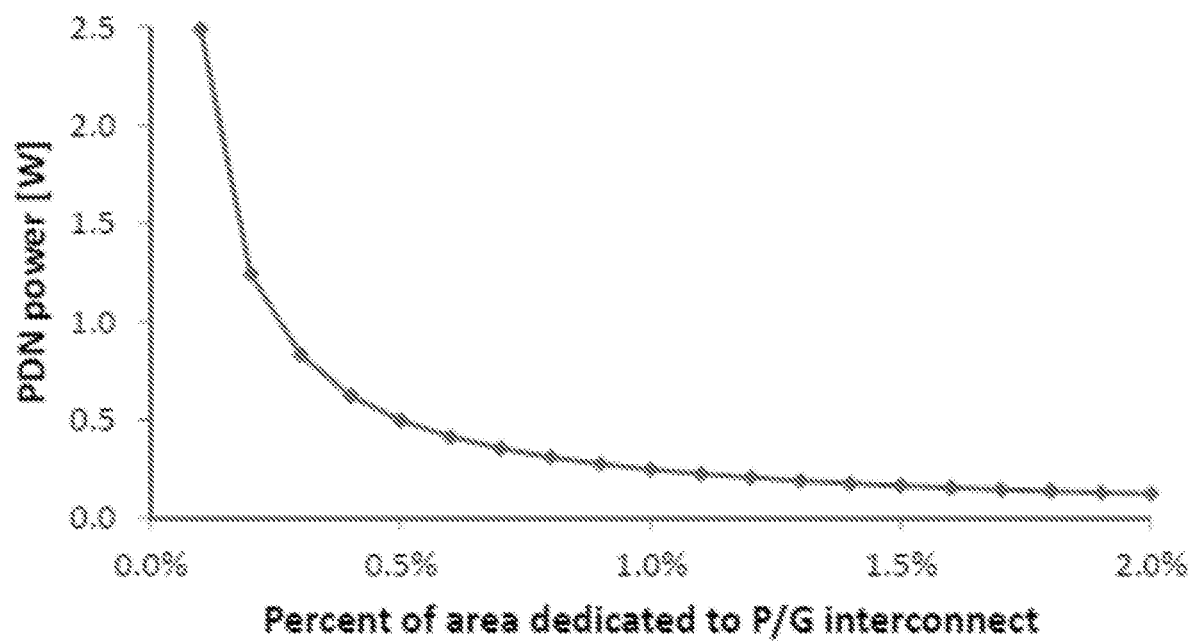
FIG. 7. Evaluation of the power dissipated by a PDN versus the percent of effective wafer area dedicated to power/ground interconnects.

Evaluation of the power dissipated by the PDN versus the percent of effective wafer area dedicated to P/G interconnects is provided in FIG. 7. For about 1% density of P/G interconnects, about 248 mW of power is dissipated within the PDN.

Conclusions

An improved power distribution approach is proposed to distribute power within a Si-IF. The power is delivered using square shaped stubs bonded on the back side of a Si-IF substrate using TCB or solder bonding. The power is then delivered to the front side of the Si-IF using TWVs, and distributed to dies by a front side metal layer. Heat associated with the large delivered power is extracted using a Cu-based PDN (TWVs and stubs). Moreover, the stubs include liquid cooling channels to facilitate effective thermal dissipation.

The PDN is evaluated for voltage drop and power dissipation. For nominal geometric and electrical parameters, the PDN exhibits a low voltage drop of about 298 μV and dissipates about 248 mW of power. The current density within the TWVs is significantly lower than the maximum specified current density for Cu vias. In addition, the PDN supports multiple voltage domains to be distributed across the Si-IF. An evaluation of P/G interconnect resource distribution is provided for two voltage domains, and a minimum ratio is identified to obtain the lowest voltage drop across the PDN.

As used herein, the singular terms "a," "an," and "the" may include plural referents unless the context clearly dictates otherwise. Thus, for example, reference to an object may include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "connect," "connected," and "connection" refer to an operational coupling or linking. Connected objects can be directly coupled to one another or can be indirectly coupled to one another, such as via one or more other objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be "substantially" or "about" the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, an object provided "on," "over," "on top of," or "below" another object can encompass cases where the former object is directly adjoining (e.g., in physical contact with) the latter object, as well as cases where one or more intervening objects are located between the former object and the latter object.

Additionally, concentrations, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not a limitation of the disclosure.

What is claimed is:

1. A silicon interconnect fabric comprising:
   a substrate having a front side and a back side;
   a front side patterned metal layer on the front side of the substrate;
   a back side patterned metal layer on the back side of the substrate;
   a plurality of conductive vias extending through the substrate and connecting the front side patterned metal layer and the back side patterned metal layer; and
   a plurality of conductive posts connected to the back side patterned metal layer, each of the conductive posts having a width and extending by a length from the back side of the substrate, wherein at least one of the conductive posts includes a liquid cooling channel extending across the width of the at least one of the conductive posts.

2. The silicon interconnect fabric of claim 1, wherein the substrate is a silicon substrate.

3. The silicon interconnect fabric of claim 1, further comprising a plurality of dies on the front side patterned metal layer.

4. The silicon interconnect fabric of claim 1, wherein the conductive vias are through wafer vias.

5. The silicon interconnect fabric of claim 1, wherein the conductive vias include copper.

6. The silicon interconnect fabric of claim 1, wherein the conductive vias have a lateral dimension in a range of 10 μm to 500 μm, and a height in a range of 100 μm to 1000 μm.

7. The silicon interconnect fabric of claim 1, wherein the conductive posts include power stubs and ground stubs.

8. The silicon interconnect fabric of claim 1, wherein the conductive posts include copper.

9. The silicon interconnect fabric of claim 1, wherein the width of the conductive posts have a dimension in a range of 0.1 mm to 10 mm, and the length of the conductive posts have a dimension in a range of 0.5 mm to 10 mm.

10. The silicon interconnect fabric of claim 1, wherein the at least one of the conductive posts includes a heat transfer liquid disposed in the liquid cooling channel.

11. A silicon interconnect fabric comprising:
a silicon substrate having a front side and a back side;
a metal layer on the front side of the silicon substrate;
a conductive pad on the back side of the silicon substrate;
a conductive post connected to the conductive pad, the conductive post having a width and extending by a length from the back side of the substrate, wherein the conductive post includes a liquid cooling channel extending across the width of the conductive post; and
a plurality of conductive vias extending through the silicon substrate and connecting the metal layer and the conductive pad.

12. The silicon interconnect fabric of claim 11, further comprising a die on the metal layer.

13. The silicon interconnect fabric of claim 11, wherein the conductive post includes a heat transfer liquid disposed in the liquid cooling channel.

14. The silicon interconnect fabric of claim 11, wherein the conductive vias are disposed over and within a perimeter of the conductive post.

15. The silicon interconnect fabric of claim 11, wherein a top end of each of the conductive vias is exposed from the silicon substrate at the front side of the silicon substrate.

16. The silicon interconnect fabric of claim 15, wherein a bottom end of each of the conductive vias is exposed from the silicon substrate at the back side of the silicon substrate.

17. The silicon interconnect fabric of claim 11, wherein the conductive pad, the conductive post, and the conductive vias are a first conductive pad, a first conductive post, and first conductive vias, respectively, and the silicon interconnect fabric further includes:
a second conductive pad on the back side of the silicon substrate;
a second conductive post connected to the second conductive pad; and
a plurality of second conductive vias extending through the silicon substrate and connecting the metal layer and the second conductive pad.

18. A silicon interconnect fabric comprising:
a substrate having a front side and a back side;
a front side patterned metal layer on the front side of the substrate;
a back side patterned metal layer on the back side of the substrate; and
a plurality of conductive posts connected to the back side patterned metal layer, each of the conductive posts having a width and extending by a length from the back side of the substrate, wherein at least one of the conductive posts includes a liquid cooling channel extending across the width of the at least one of the conductive posts.

19. The silicon interconnect fabric of claim 18, wherein the conductive posts include power stubs and ground stubs.

20. The silicon interconnect fabric of claim 18, wherein the width of the conductive posts have a dimension in a range of 0.1 mm to 10 mm, and the length of the conductive posts have a dimension in a range of 0.5 mm to 10 mm.

* * * * *